United States Patent
Tokunaga

(10) Patent No.: US 6,817,822 B2
(45) Date of Patent: Nov. 16, 2004

(54) LOAD PORT, WAFER PROCESSING APPARATUS, AND METHOD OF REPLACING ATMOSPHERE

(75) Inventor: Kenji Tokunaga, Tokyo (JP)

(73) Assignee: Semiconductor Leading Edge Technologies, Inc., Ibaraki (JP)

( * ) Notice: Subject to any disclaimer, the term of this patent is extended or adjusted under 35 U.S.C. 154(b) by 0 days.

(21) Appl. No.: 10/207,011

(22) Filed: Jul. 30, 2002

(65) Prior Publication Data

US 2003/0031537 A1 Feb. 13, 2003

(30) Foreign Application Priority Data

Aug. 1, 2001 (JP) ........................................ 2001-233959

(51) Int. Cl.[7] .............................................. H01L 21/68
(52) U.S. Cl. ...................................................... 414/217
(58) Field of Search ............................. 414/217.1, 217

(56) References Cited

U.S. PATENT DOCUMENTS 5,586,585 A * 12/1996 Bonora et al. ................ 141/93
6,224,679 B1 * 5/2001 Sasaki et al. ................ 118/719
6,481,945 B1 * 11/2002 Hasper et al. ............... 414/217

FOREIGN PATENT DOCUMENTS

| JP | 08-046005 A | 2/1996 | |
| JP | 11-145245 A | 5/1999 | |
| JP | 11-307623 A | 11/1999 | |
| JP | 11-345858 A | 12/1999 | |
| WO | WO 99/65064 A1 | 12/1999 | |
| WO | WO 99/65064 | * 12/1999 | ........... H01L/21/00 |
| WO | WO 01/08210 A1 | 2/2001 | |

* cited by examiner

Primary Examiner—Eileen D. Lillis
Assistant Examiner—Charles A. Fox
(74) Attorney, Agent, or Firm—Foley & Lardner LLP

(57) ABSTRACT

Atmosphere inside a wafer carrier is purged through an open face of the wafer carrier, in the state where a carrier door constituting a face of the wafer carrier is opened by a load port door. Purging is carried out by partitioning a mini-environment with an upper wall surface, a lower wall surface, and an EFEM door into a predetermined space adjacent to the open face, by discharging gas from the predetermined space through an exhaust opening, and by supplying an inert gas or a dry air from a gas supply port into the predetermined space.

2 Claims, 10 Drawing Sheets

LOAD PORT, WAFER PROCESSING APPARATUS, AND METHOD OF REPLACING ATMOSPHERE

BACKGROUND OF THE INVENTION

1. Field of the Invention

The present invention relates to a load port for opening and closing a door of a wafer carrier, a wafer processing apparatus, and a method of replacing atmosphere.

2. Description of the Background Art

Heretofore, a wafer carrier has been used as a container for holding wafers in a manufacturing process of semiconductor devices.

FIG. 9 is a perspective view illustrating a known wafer carrier of side-door integrated type. FIG. 10 is a perspective view showing an inside of a carrier door 20 of the wafer carrier 100 shown in FIG. 9.

Wafer carriers as shown in FIG. 9 include, for example, a wafer carrier shown in a catalog made by FLUOROWARE company. This type of wafer carrier is referred to as FOUP in the SEMI Standards. FOUP is the abbreviation of a "front opening unified pod." Detailed information, such as dimensions, is described in the SEMI Standards E 52, E 1.9, or E 47.1.

In FIGS. 9 and 10, reference numeral 100 denotes a wafer carrier used as a container for holding wafers, 10 denotes a carrier shell, 12 denotes a robot flange, 13 denotes a manual handle, and 14 denotes a side rail. Reference numeral 20 denotes a carrier door, 21 denotes a sealing member (packing), 22 denotes a retainer for holding wafers, 23 denotes an engaging piece of a door-clamping mechanism (stopper mechanism) for engaging to the carrier shell 10, 24 denotes a registration-pin hole, and 25 denotes a latchkey hole. Although not shown in the drawings, inside the carrier shell 10 are formed wafer teeth for seating wafers, holes corresponding to the engaging piece 23 of the door-clamping mechanism of the carrier door 20, thick portions, and sealing portions or the like.

As FIG. 9 shows, the wafer carrier 100 includes the carrier shell 10 and the carrier door 20. The carrier shell 10 is a housing having an open face in one surface, and the carrier door 20 fits to the carrier shell 10 at this open face. In the state where the carrier door 20 fits to the carrier shell 10, that is, in the state where the carrier door 20 is closed, the wafer carrier 100 is in a sealed state.

As shown in FIG. 10, inside the carrier door 20, a sealing member 21 is provided on the portion contacting the carrier shell 10. This is used for maintaining the air-tightness of the wafer carrier 100.

Unlike an open cassette (SEMI Standards E 1.9 and others, before 8-inch wafers), the wafer carrier 100 protects wafers from foreign matter in the air and chemical contamination by holding substrates to be processed (hereafter referred to as "wafer") in a sealed space.

On the other hand, in order to stop the above-described wafer carrier 100 at a wafer processing apparatus (semiconductor manufacturing apparatus), and to open and close the carrier door 20 to load and unload wafers, a load port having an FIMS face specified in the SEMI Standards is required. FIMS is an abbreviation of "front-opening interface mechanical standard".

FIG. 11 is a sectional view for illustrating a conventional wafer processing apparatus comprising a load port.

As FIG. 11 shows, the load port 300 comprises a wall surface (body surface) for separating the mini-environment 40 in the wafer processing apparatus 200 from the exterior; a kinematic pin 31 used for aligning the wafer carrier 100 on an installation table 30; and a load port door (FIMS door) 32 fitted to the carrier door 20, and taken in the mini-environment 40 in the wafer processing apparatus 200 together with the carrier door 20 after the opening operation of the doors. Among the wall surfaces of the wafer processing apparatus 200, a surface contacting a sealing surface (FOUP sealing surface) 26 of the carrier shell 10 and maintaining air-tightness is called an FIMS sealing surface 27.

The wafer processing apparatus 200 also comprises a wafer-transferring robot 41, and an FFU (fan filter unit) 42 for cleaning the air in the mini-environment 40.

The sealed-type wafer carriers 100, such as FOUP, are generally formed of a high-performance plastic material. However, since plastic materials have a property to permeate moisture or the like, moisture or the like may enter inside the wafer carrier 100. In addition, outside air may permeate into the wafer carrier 100 through the sealing material 21 due to the mechanism of molecular diffusion or the like.

Therefore, the humidity, oxygen content, or the like tend to increase with the lapse of time.

Also, when wafers whereto a photoresist is applied are stocked in a wafer carrier 100, the organic solvent vaporized from the photoresist applied to the wafers may adhere to the internal wall of the wafer carrier 100. In this case, even after the wafers are removed, the organic solvent adhered to the internal wall of the wafer carrier 100 may remain intact. Thereafter, by the re-vaporization of the organic solvent, the atmosphere inside the wafer carrier 100 may be contaminated by organic compounds.

As a measure against such elevations of humidity and oxygen content, and organic contamination in a wafer carrier 100, there has been proposed a method to introduce $N_2$ or dry air from the bottom of the wafer carrier 100 in the state where the carrier door 20 is closed to replace the atmosphere inside the wafer carrier 100.

However, as FIG. 11 shows, a plurality of wafers 16 are horizontally accommodated in the wafer carrier 100. Therefore, there has been a problem that wafers or the like accommodated in the wafer carrier 100 interfere with $N_2$ gas or the dry air to replace the atmosphere inside the wafer carrier 100.

As described above, even if the airtight wafer carrier 100 is used, there has been a problem that outside air or moisture or the like permeates due to the characteristics of plastics or rubber, and humidity or oxygen content inside the wafer carrier 100 may increase. Also, by accommodating wafers 16 whereto a photoresist is applied are accommodated, the atmosphere inside the wafer carrier 100 may be contaminated by organic compounds.

Even if $N_2$ gas or dry air is simply introduced into the wafer carrier 100, obstructs in the wafer carrier 100, such as wafers 16, make it difficult to replace the atmosphere inside the wafer carrier 100 with a clean gas in a short time.

However, the elevation of humidity or oxygen content in the wafer carrier 100, or organic contamination of the wafer carrier 100 raises problems of the growth of native oxide films, and poor withstand voltage of the gate.

SUMMARY OF THE INVENTION

The present invention has been conceived to solve the previously-mentioned problems and aims at providing a load port, a wafer processing apparatus, and a method of replacing gas that can replace the atmosphere inside the wafer carrier efficiently in a short time.

The above objects of the present invention are attained by a following load port, by a following wafer processing apparatus and by a following method of replacing atmosphere.

According to a first aspect of the present invention, the load port for placing a wafer carrier thereon comprises a first door for opening and closing a carrier door constituting a face of the wafer carrier. An atmosphere replacing mechanism purges atmosphere inside the wafer carrier through an open face of the wafer carrier in the state where the carrier door is open.

According to a second aspect of the present invention, the wafer processing apparatus having a load port for placing a wafer carrier thereon comprises a first door for opening and closing a carrier door constituting a face of the wafer carrier. An atmosphere replacing mechanism purges the atmosphere inside the wafer carrier through an open face of the wafer carrier in the state where the carrier door is open.

According to a third aspect of the present invention, in the method of replacing atmosphere by purging the atmosphere inside a wafer carrier placed on a load port of a wafer processing apparatus, the atmosphere inside the wafer carrier is purged, after transferring wafers after predetermined processing, through an open face of the wafer carrier in the state where the carrier door is open.

Other objects and further features of the present invention will be apparent from the following detailed description when read in conjunction with the accompanying drawings.

DETAILED DESCRIPTION OF THE PREFERRED EMBODIMENTS

Figure 1:
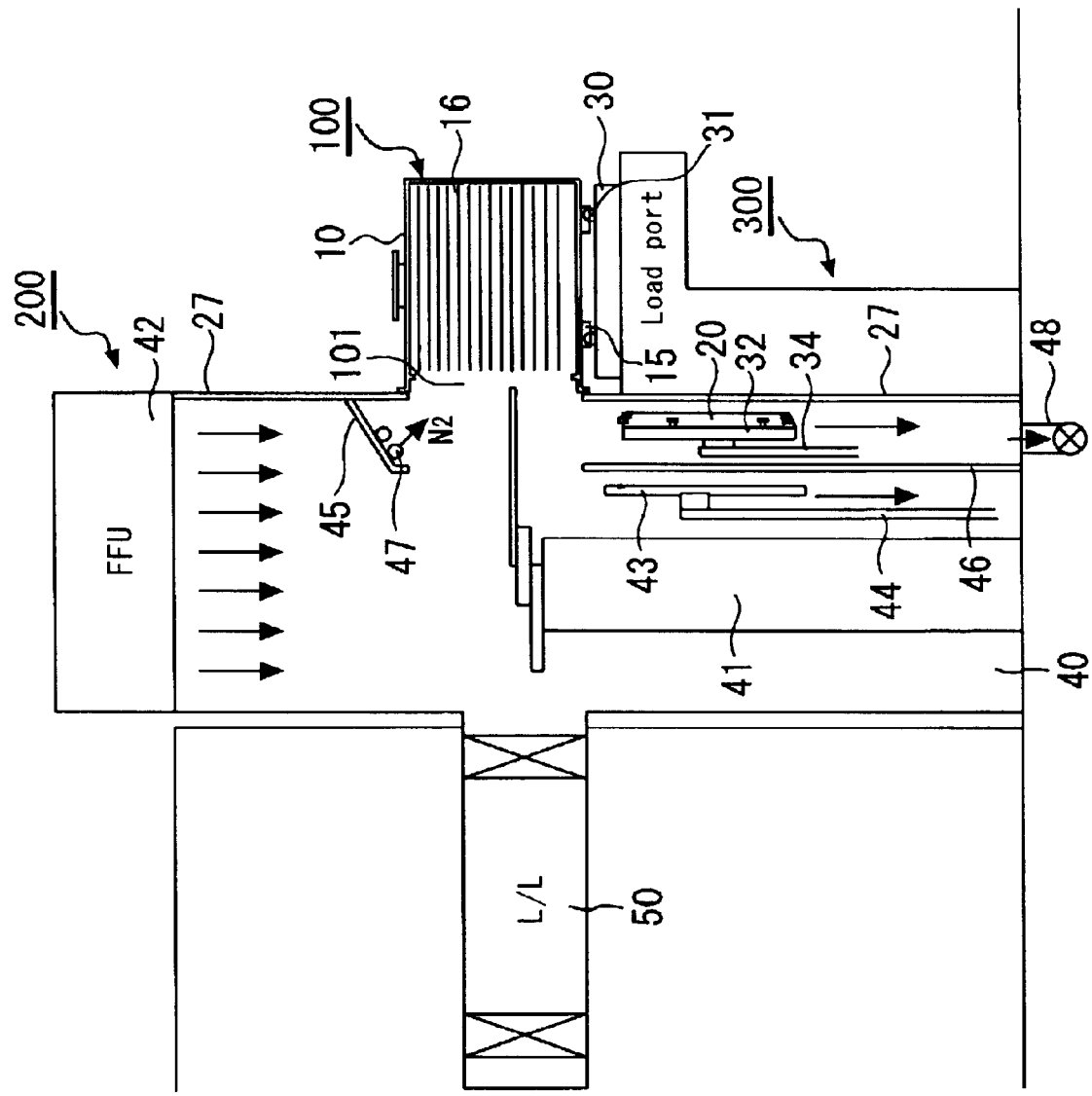
FIG. 1 is a sectional view for illustrating a wafer processing apparatus having a load port during transfer of wafers according to First Embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

First, referring to FIGS. 1 to 3, a load port for loading a wafer carrier placed thereon, and a wafer processing apparatus having the load port will be described.

Figure 2:
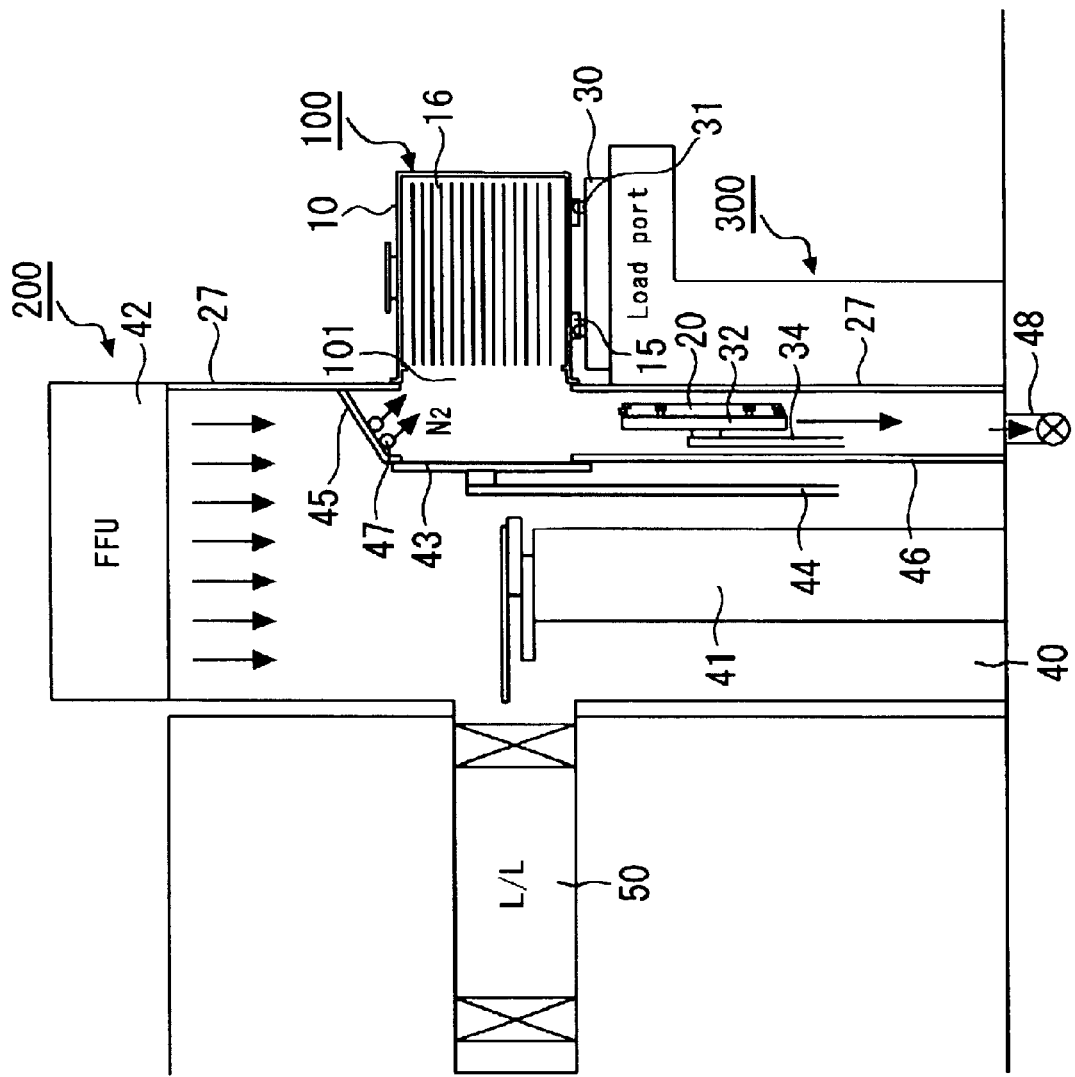
FIG. 2 is a sectional view for illustrating a wafer processing apparatus having a load port during replacement of atmosphere according to First Embodiment of the present invention.
Figure 3:
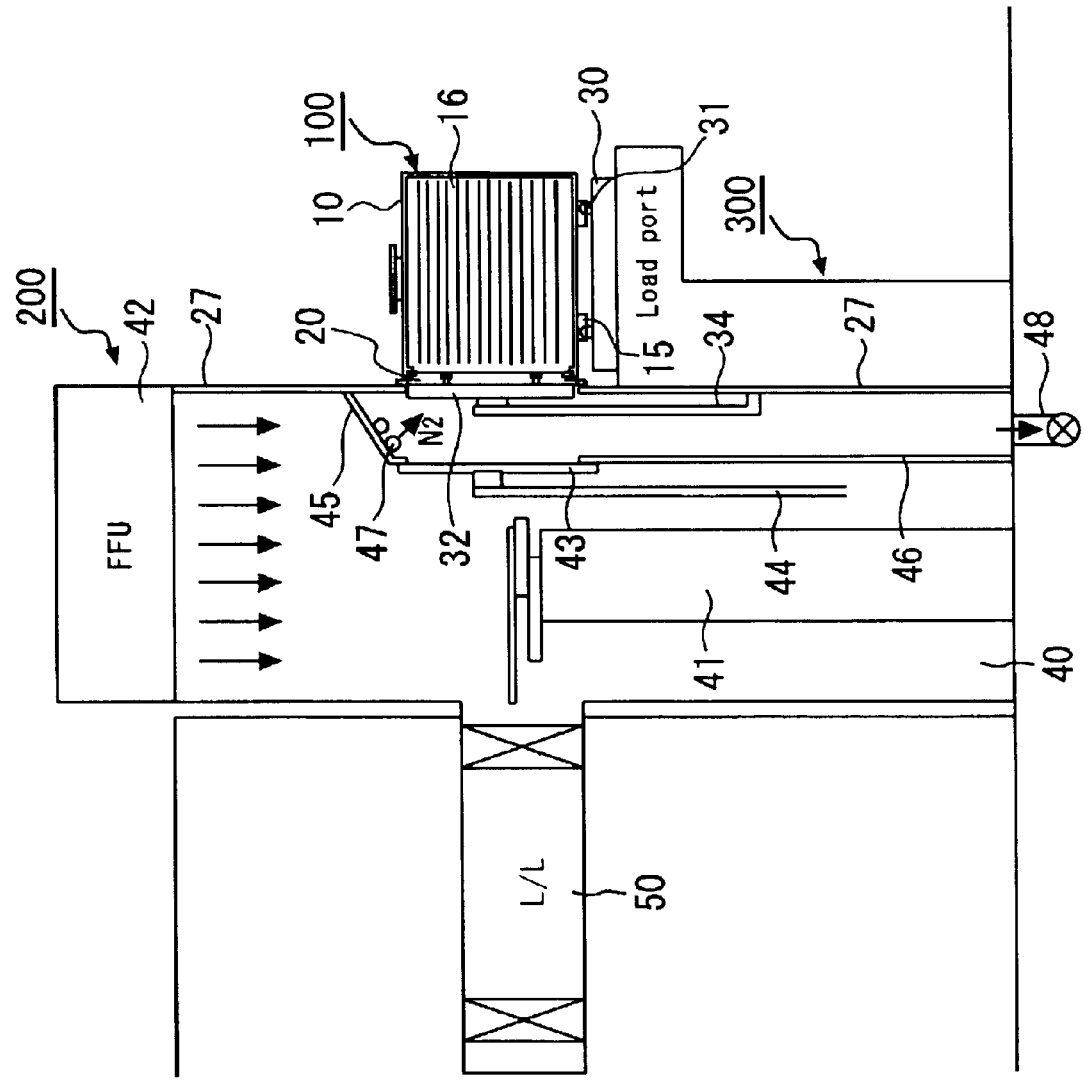
FIG. 3 is a sectional view for illustrating a wafer processing apparatus having a load port after completion of replacing the atmosphere according to First Embodiment of the present invention.

FIGS. 1 to 3 are sectional views for illustrating a wafer processing apparatus having a load port according to First Embodiment of the present invention. Specifically, FIG. 1 shows a wafer processing apparatus during the transfer of wafers; FIG. 2 shows a wafer processing apparatus during the replacement of the atmosphere; and FIG. 3 shows a wafer processing apparatus after the completion of replacing the atmosphere.

In FIGS. 1 to 3, reference numeral 100 denotes a wafer carrier (container for holding substrates) for accommodating wafers 16 therein as substrates to be processed, 10 denotes a carrier shell, and 20 denotes a carrier door. Details of the wafer carrier 100 will be described later.

Reference numeral 200 denotes a wafer processing apparatus (semiconductor manufacturing apparatus), such as a cleaning apparatus, an etching apparatus, a resist-applying apparatus, a CVD apparatus, and a PVD apparatus; and 300 denotes a load port for placing the wafer carrier 100 on the table 30. Reference numeral 40 denotes a mini-environment as a space for transferring wafers; 41 denotes a wafer-transferring robot for transferring wafers between a load lock chamber 50 and the wafer carrier 100; and 42 denotes an FFU (Fan Filter Unit) for cleaning the air in the mini-environment 40 with a laminar flow (also called down flow, shown by arrows in the drawings).

The load port 300 comprises a wall surface (body surface) 27 for separating the mini-environment 40 in the wafer processing apparatus 200 from the exterior; a kinematic pin 31 for placing the wafer carrier 100 on a predetermined position of the table 30; a load port door (FIMS door) 32 as a first door fitted to the carrier door 20, and for opening and closing the door 20; and a mechanism 34 for opening and closing a load port door. The load port door 32 constitutes a part of the wall surface 27 of the wafer processing apparatus 200. In First Embodiment, the wall surface 27 of the wafer processing apparatus 200 constitutes a part of the FIMS surface corresponding to the FOUP of the SEMI Standards.

Furthermore, the load port 300 comprises a mechanism for purging the atmosphere inside the wafer carrier 100 through the open face 101 of the wafer carrier 100 in the state where the carrier door 20 is open. Specifically the load port 300 comprises an upper wall surface 45, a lower wall surface 46, and an EFEM (equipment front end module) door 43 that define a predetermined space adjacent to the open face 101, a gas supply port 47 for supplying an inert gas ($N_2$) or a dry air into the predetermined space, and an exhaust opening 48 for discharging gas from the predetermined space.

Here, the EFEM door 43 as a second door is opened or closed by a mechanism 44 for opening and closing an EFEM door. As shown in FIG. 1, the EFEM door 43 is positioned at the lower end, that is, in the state where the EFEM door 43 is opened during the transfer of wafers. As FIG. 2 shows, the above-described predetermined space is defined in the state where the EFEM door 43 is positioned at the upper end, that is, the EFEM door 43 is closed. That is, the mini-environment 40, which is a space for transferring wafers, is partitioned into small spaces adjacent to the open face 101.

Next, the wafer carrier 100 to be placed on the load port 300 will be described below.

Figure 4:
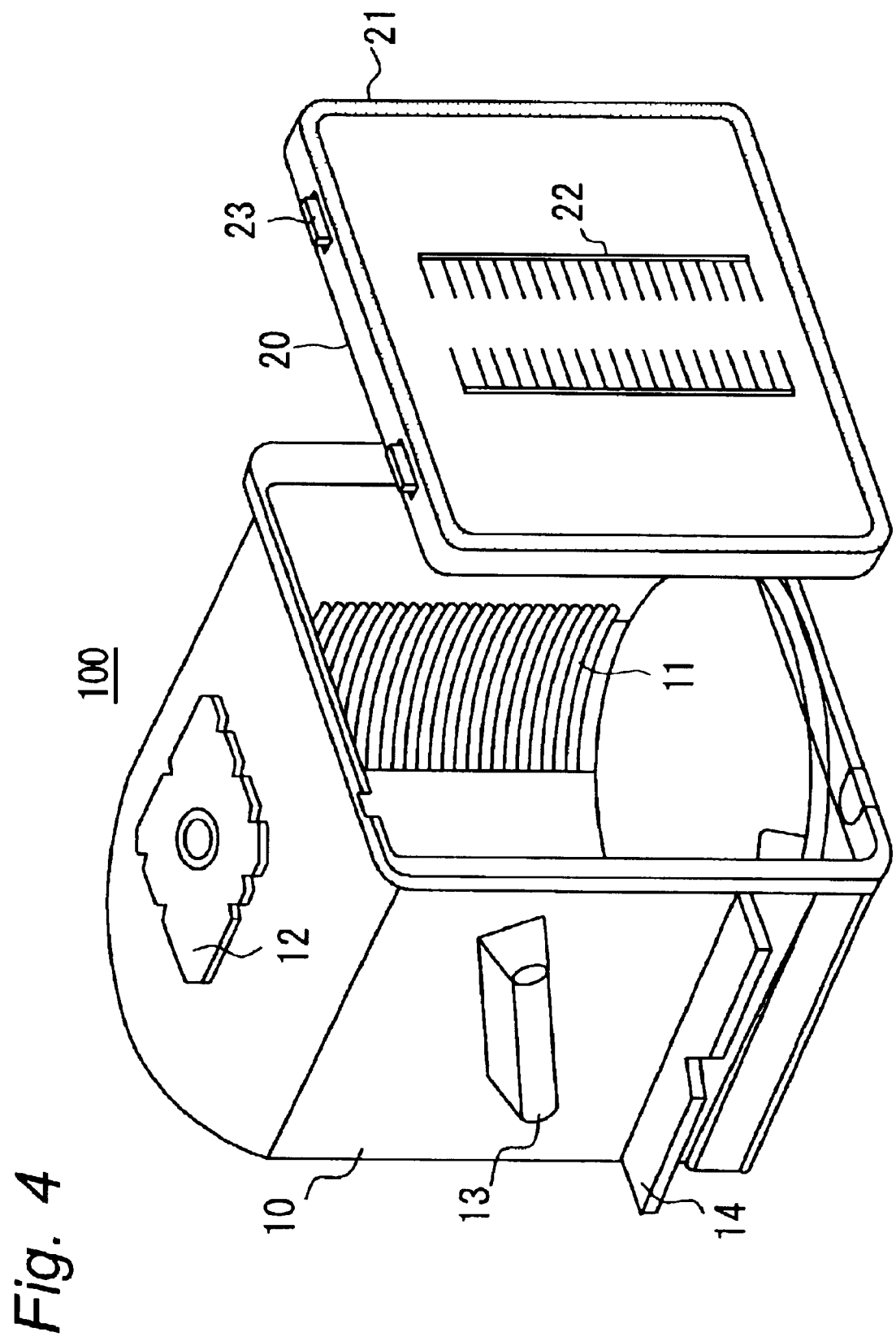
FIG. 4 is a perspective view for illustrating the wafer carrier to be placed on the load port in First Embodiment.
Figure 5:
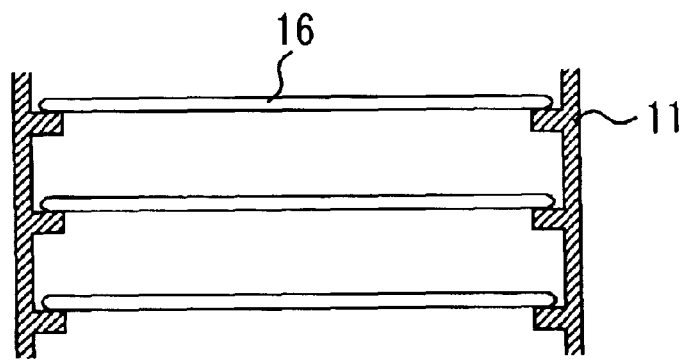
FIG. 5 is a sectional view for illustrating the state of wafers accommodated in the wafer carrier in First Embodiment.

FIG. 4 is a perspective view for illustrating the wafer carrier 100 to be placed on the load port 300 in First Embodiment. FIG. 5 is a sectional view for illustrating the state of wafers 16 accommodated in the wafer carrier 100.

In FIG. 4, reference numeral 100 denotes a wafer carrier as a container for accommodating wafers, 10 denotes a carrier shell, and 20 denotes a carrier door. Here, in FIG. 4, the carrier door 20 is separated from the carrier shell 10, and the inside of the door is shown. In First Embodiment, a FOUP of the SEMI Standards is used as the wafer carrier 100.

The carrier shell 10 is a housing having an open face on a part thereof, and the carrier door 20 is fitted to the carrier shell 10 at this open face. The carrier shell 10 and the carrier door 20 are generally formed of a high-performance plastic material.

Reference numeral 11 denotes wafer teeth provided on the inner wall of the carrier shell 10, and 22 denotes retainers provided on the inside of the carrier door 20 and for holding wafers. A plurality of wafers are horizontally held in the wafer carrier 100 by the wafer teeth 11 and the retainers 22 having a shelf structure. Specifically, as FIG. 5 shows, the wafer teeth 11 have a shelf structure using protrusions provided on the wall surface at a constant interval, and wafers 16 are placed on the upper surfaces of the protrusions. Since the protrusions are provided on the wall surface at a constant interval, a plurality of wafers 16 are accommodated in the wafer carrier 100 apart from each other by a constant interval.

In FIG. 4, reference numeral 12 denotes a robot flange, 13 denotes a manual handle, and 14 denotes a side rail for transferring the wafer carrier 100, all of which are installed on the outside of the carrier shell 10.

Reference numeral 21 denotes a sealing member (packing), and 23 denotes an engaging piece of the door-clamping mechanism. The sealing member 21 is installed on the surface where the carrier door 20 contacts the carrier shell 10, and is adopted to maintain air-tightness of the carrier shell 10. The sealing member 21 is generally made of a rubber material. The engaging piece 23, engaging piece the door-clamping mechanism is engaged to the engaging hole (not shown) provided on the carrier shell 10 to fix the carrier door fitted to the carrier shell 10.

Figure 9:
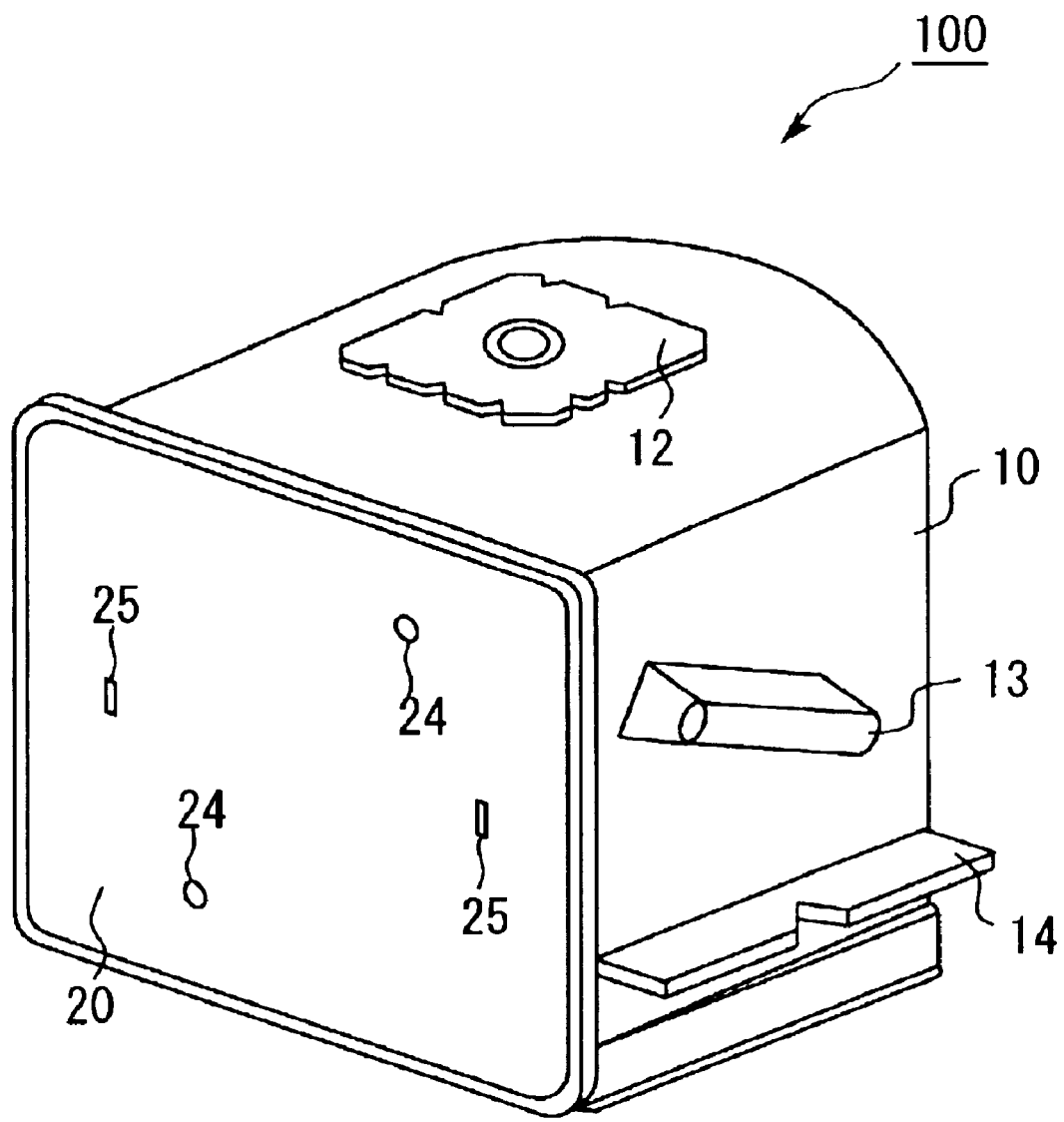
FIG. 9 is a perspective view illustrating a known wafer carrier of side-door integrated type.
Figure 10:
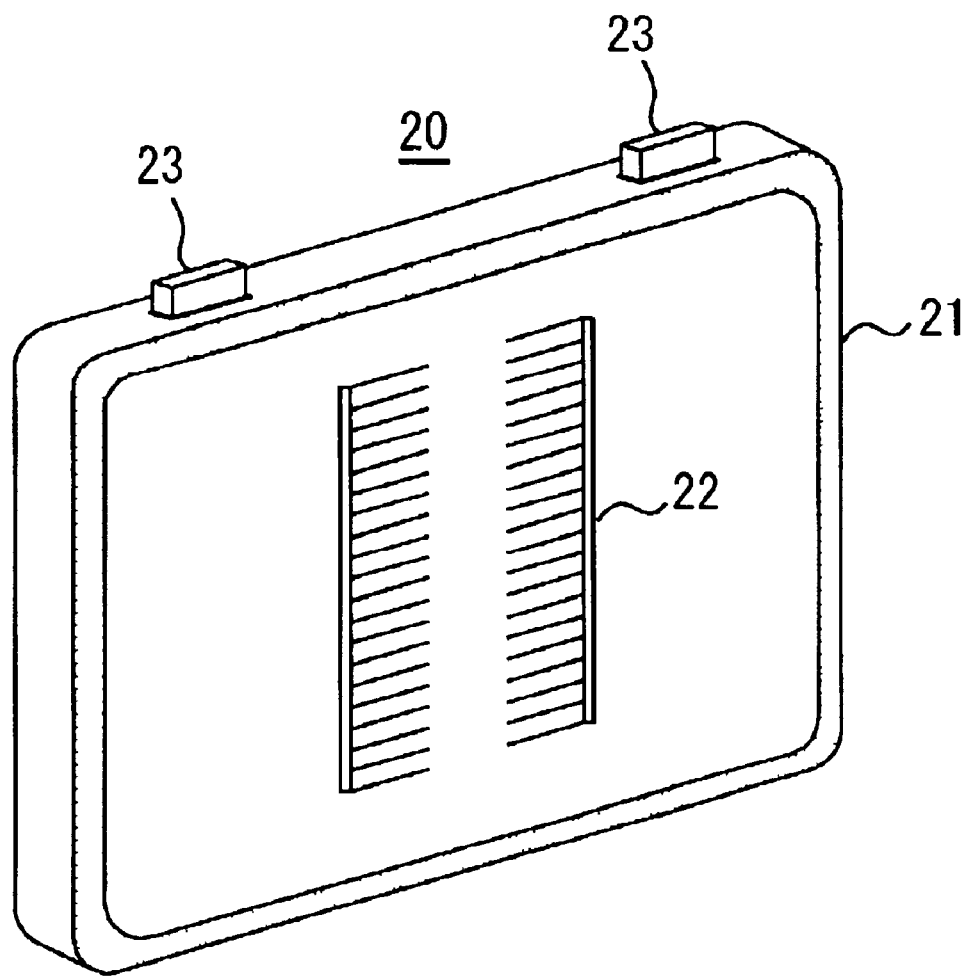
FIG. 10 is a perspective view illustrating an inside of a carrier door of the wafer carrier shown in FIG. 9.
Figure 11:
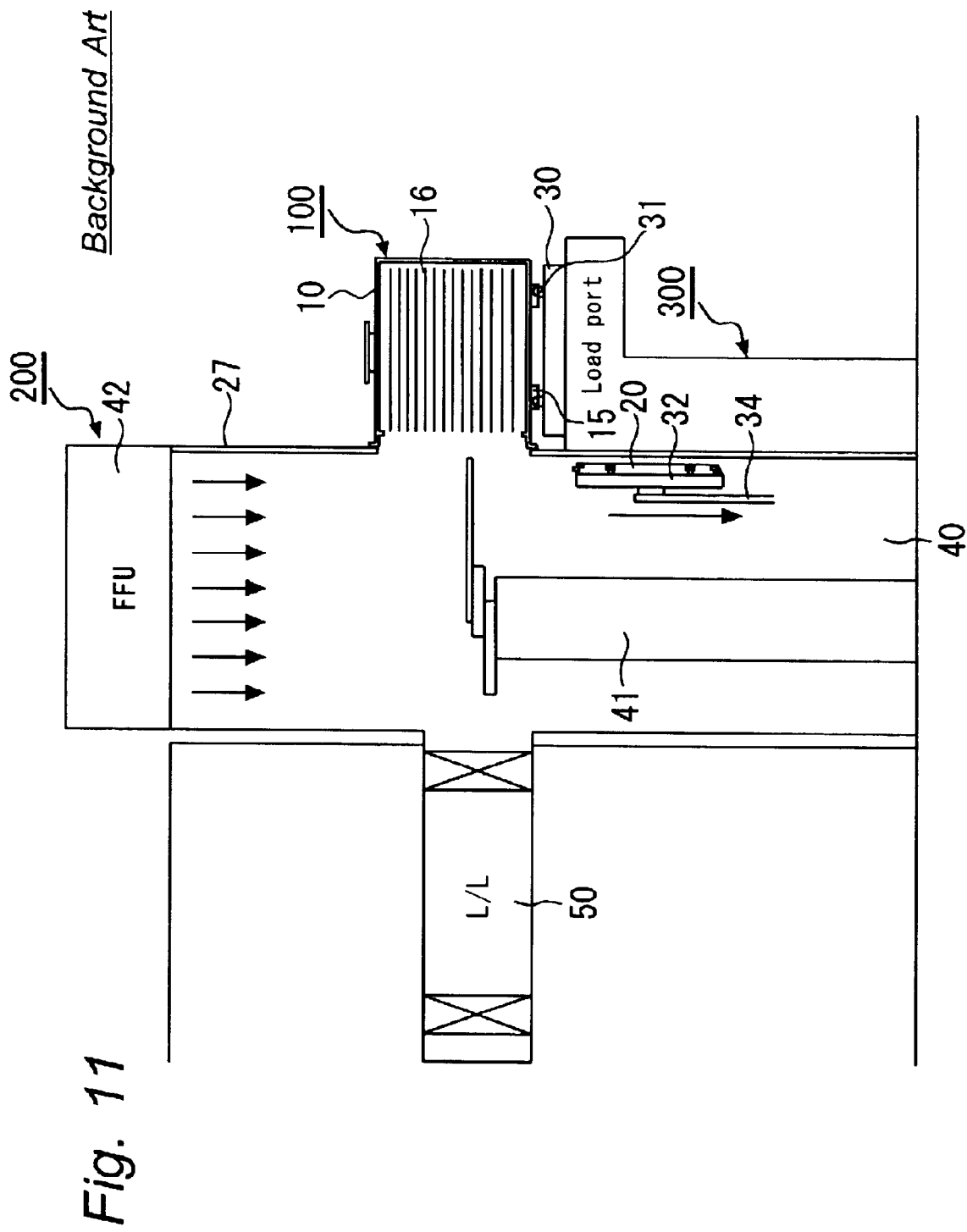
FIG. 11 is a sectional view for illustrating a conventional wafer processing apparatus comprising a load port.

On the outer surface of the carrier door 20 are provided a registration-key hole 24 and a latchkey hole 25 (refer to FIG. 9). Here, the registration-key hole 24 receives a registration pin (not shown) for registering, and is used for alignment. The latchkey hole 25 receives a latchkey 33 (refer to FIG. 9) for opening and closing the carrier door 20.

Next, a method of replacing (purging) the atmosphere inside the wafer carrier 100 placed on the load port 300 will be described below referring to FIGS. 1 to 3.

After wafers 16 have been processed in the processing chamber or the processing tank or the like of the wafer processing apparatus 200, as FIG. 1 shows, the processed wafers 16 are returned from the load lock chamber 50 to the wafer carrier 100 using a wafer-transferring robot 41.

When wafers are transferred, it is not always required to supply an inert gas from the gas supply port 47; however, since the laminar flow from the FFU 42 is interfered in the vicinity of the FIMS sealing surface (wall surface) 27, that is, in the vicinity of the open face 101 by the upper wall surface 45, it is preferable to supply the inert gas at a very low rate from the gas supply port 47. At the same time, it is preferable to exhaust gas through the exhaust opening 48. Thereby, the same cleaning effect as the laminar flow can be achieved, and in the vicinity of the upper wall surface 45, the effect to inhibit the turbulence of the laminar flow can be achieved.

Next, as FIG. 2 shows, when the transfer of wafers is completed, the EFEM door 43 is closed by the mechanism 44 for opening and closing an EFEM door. Thereby, a predetermined small space adjacent to the open face 101 is partitioned (isolated) from the mini-environment 40. In other words, the upper wall surface 45, the EFEM door 43, and the lower wall surface 46 define a predetermined space. Then, the gas in the above-described space is exhausted through the exhaust opening 48, and an inert gas or a dry air is supplied from the gas supply port 47 into the space.

At this time, since the atmosphere inside the wafer carrier 100 is purged (atmosphere replacement) through the open face 101 of the wafer carrier 100 in the state where the carrier door 20 is open, the atmosphere can be replaced in a short period of time. Also, by reducing the volume of the space to purge to the above-described small space, comparing to the case of replacement of the atmosphere in the entire mini-environment 40, the consumption of the inert gas (or dry air) can be lowered, and time for atmosphere replacement can be shortened. Therefore, the atmosphere can be replaced efficiently.

After the atmosphere replacement in the wafer carrier 100 has been completed, as FIG. 3 shows, the load port door 32 is closed by the mechanism 34 for opening and closing a load port door. Thereby, the carrier door 20 is contacted to the carrier shell 10. At this time also, in the same manner as when the wafers are transferred (refer to FIG. 1), it is preferable to exhaust the atmosphere through the exhaust opening 48, and to supply the gas at the very low flow rate from the gas supply port 47, Next, an automatic conveying mechanism and an automatic conveying method of the wafer carrier 100 in a production site will be described below.

Figure 6:
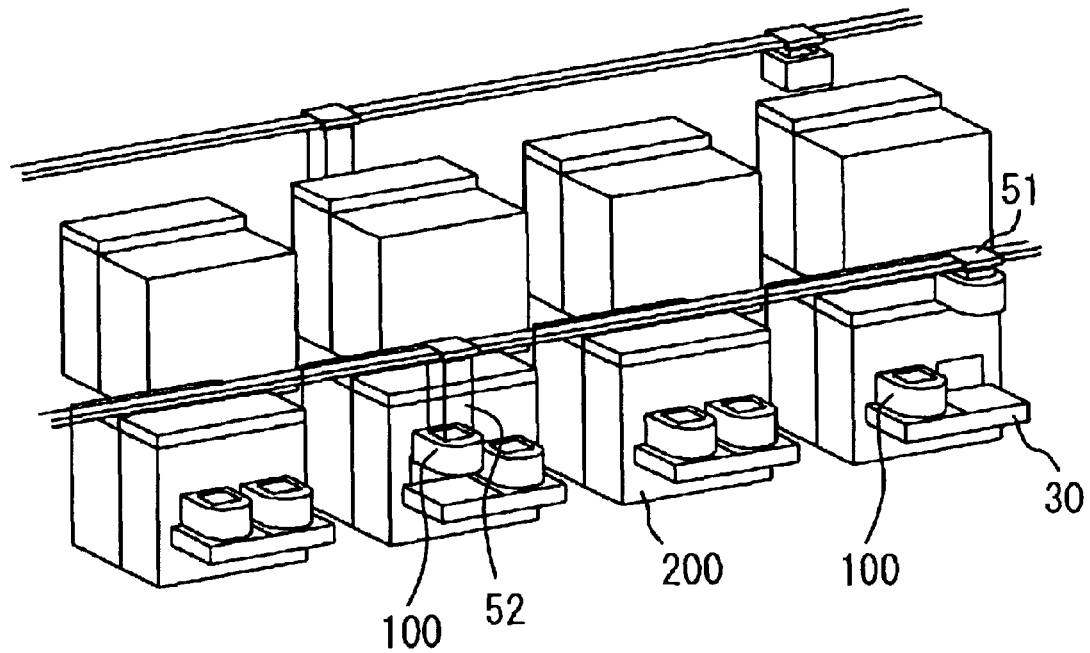
FIG. 6 is a schematic diagram for illustrating an automatic conveying method of the wafer carrier in a production site where a plurality of wafer processing apparatuses is installed in First Embodiment.

FIG. 6 is a schematic diagram for illustrating an automatic conveying method of the wafer carrier 100 in a production site where a plurality of wafer processing apparatuses are installed. Referring FIG. 6, an automatic conveying mechanism and an automatic conveying method of the wafer carrier 100 using an OHT (overhead hoist transport) will be described.

In FIG. 6, reference numeral 30 denotes a table of the load port, 51 denotes an OHT, 52 denotes a hoist mechanism, 200 denotes wafer processing apparatus, and 100 denotes wafer carriers.

The OHT 51 is a typical automatic conveying system for wafer carriers 100 in a bay of a semiconductor factory. A plurality of wafer processing apparatuses 200 linearly installed are provided with load ports, more specifically tables 30, and on the tables 30, wafer carriers 100 conveyed using the hoist mechanism 52 are placed.

Next, a method of conveying wafer carriers 100 together with replacing the atmosphere inside the wafer carriers 100 will be described below.

In a semiconductor factory, wafers 16 to be undergone various processes move between wafer processing apparatuses 200 in the state where the wafers 16 are accommodated in the wafer carriers 100. Since a wafer carrier 100 accommodating wafers 16 of a 300-mm diameter class weighs 8 kg or more, conveying by hand is difficult to consider from the safety point of view, and an automatic conveying machine such as an OHT 51 is used.

In the example of FIG. 6, first a wafer carrier 100 accommodating wafers 16 is conveyed from the stocker (not shown) installed in the process to a wafer processing apparatus 200 using an OHT 51.

Next, the wafer carrier 100 is placed on the table 30 of the load port of the wafer processing apparatus 200 and set on a predetermined location using the hoist mechanism 52. Then, V-grooves 15 (refer to FIG. 8) provided on the lower surface of the wafer carrier 100 are guided above kinematic pins 31 (refer to FIG. 8) on the table 30, and fixed in predetermined positions. The alignment of the wafer carrier 100 will be described later (refer to FIG. 7).

Then, the hoist mechanism 52 is released from the wafer carrier 100, thus leaving the wafer carrier 100 on the table 30.

Thereafter, the wafer carrier 100 is advanced to push the carrier door 20 against the load port door (FIMS surface of the load port 300) 32. Here, the FIMS surface means a surface constituted by the wall surface 27 of the wafer processing apparatus 200 (refer to FIG. 8) and the surface where the load port door 32 contacts the carrier door 20. Next, by rotating the latchkey 33 (refer to FIG. 8), the engaging piece 23 of the door-clamping mechanism of the carrier door 20 is released from the carrier shell 10, and the carrier door 20 is fixed to the load port door 32. Thus, the wafer carrier 100 contacts the load port 300 of the wafer processing apparatus 200. That is, a sealing surface 26 of the wafer carrier 100 is in contact with the FIMS sealing surface 27 of the load port 300, and the carrier door 20 is in contact with the load port door 32.

Next, the load port door 32 is opened with the mechanism 34 for opening and closing a load port door to separate the carrier door 20 from the carrier shell 10, and moved to the lower portion in the wafer processing apparatus 200. In the state where the carrier door 20 is separated, the wafers 16 are removed through the open face (front surface) 101 of the wafer carrier 100 using the wafer-transferring robot 41, and conveyed into the load lock chamber 50 in the wafer processing apparatus 200. Thereafter, in the processing chamber (not shown) of the wafer processing apparatus 200, the wafers 16 are undergone predetermined processes.

After the wafers 16 have been undergone predetermined processes, the processed wafers 16 are returned from the load lock chamber 50 to the wafer carrier 100 using the wafer-transferring robot 41 (refer to FIG. 1). When wafers are transferred, it is not always required to supply an inert gas from the gas supply port 47; however, since the laminar flow from the FFU 42 is interfered in the vicinity of the open face 101, it is preferable to supply the inert gas at a very low rate from the gas supply port 47. At the same time, it is preferable to exhaust gas through the exhaust opening 48.

Next, the EFEM door 43 is closed by using the mechanism 44 for opening and closing an EFEM door (refer to FIG. 2). Thereby, a predetermined small space adjacent to the open face 101 is partitioned (isolated) from the mini-environment 40. Then, gas is exhausted from the above-described space through the exhaust opening 48, and at the same time, an inert gas or a dry air is supplied from the gas supply port 47 into the above-described space. At this time, since the atmosphere inside the wafer carrier 100 is purged (atmosphere replacement) through the open face 101 of the wafer carrier 100, atmosphere replacement can be performed in a short period of time.

After atmosphere inside the wafer carrier 100 has been replaced, the load port door 32 is closed using the mechanism 34 for opening and closing a load port door (refer to FIG. 3). Thereby, the carrier door 20 is brought in contact with the carrier shell 10. At this time also, it is preferable to exhaust the atmosphere through the exhaust opening 48, and to supply the gas at a very low rate from the gas supply port 47.

Next, the latchkey 33 (refer to FIG. 8) is turned to activate the door-clamping mechanism 23, and the carrier door 20 is fixed to the carrier shell 10.

Thereafter, the wafer carrier 100 is recessed to the transfer position. Furthermore, responding to the request of conveying, the vacant OHT 51 is stopped above the table 30 of the load port whereon the wafer carrier 100 subjected to the request of conveying, and the robot flange 12 is held and lifted using the robot hand (not shown) of the hoist mechanism 52.

Next, after the wafer carrier 100 is conveyed to the stocker using the OHT 51 and stocked temporarily, the wafer carrier 100 is conveyed to the next process step (for example, the film-forming step, the ashing step, or the like). By repeating such process flows, desired circuits are formed on the wafers 16.

In the above-described process flow of semiconductor manufacturing, the carrier door 20 is closed in the time other than the time when the wafer carrier 100 is brought in contact with the FIMS surface on the load port 300. That is, the wafer carrier 100 is in an airtight state.

Furthermore, suitable examples of the above-described wafer processing apparatus 200 include a pre-cleaning apparatus. After native oxide films on the surfaces of the wafers 16 have been removed by pre-cleaning, the wafers 16 are transferred to the wafer carrier 100, the EFEM door 43 is closed, and the atmosphere inside the wafer carrier 100 is replaced. Since this atmosphere replacement is carried out through the open face 101 of the wafer carrier 100 in the state where the carrier door 20 is open, it can be performed efficiently in a short time. Therefore, moisture content, oxygen content, and organic contamination in the wafer carrier (FOUP) 100 can be minimized, and the formation of native oxide films can be inhibited.

Next, the principle of the alignment of the wafer carrier on the above-described load port will be described below.

Figure 7A:
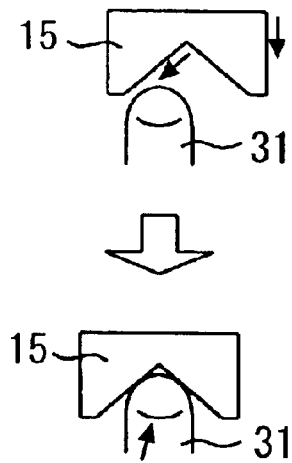
FIGS. 7A and 7B are views for illustrating the principle for aligning a wafer carrier on the table of a load port in First Embodiment.
Figure 7B:
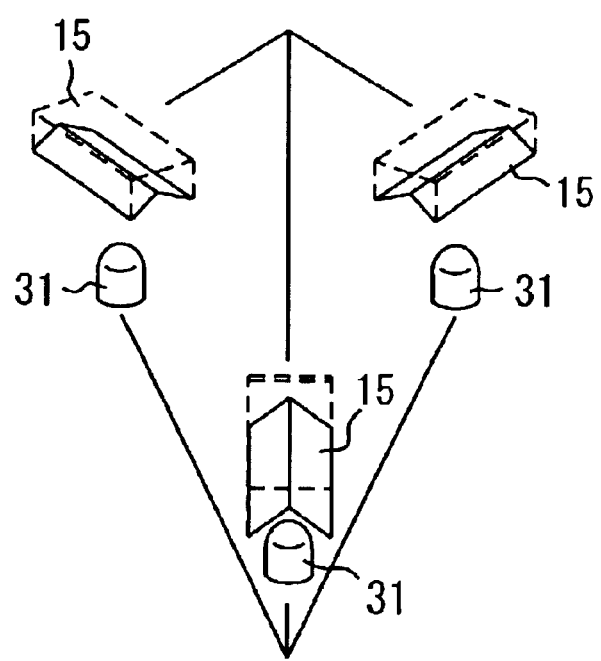

FIGS. 7A and 7B are views for illustrating the principle for aligning a wafer carrier 100 on the table 30 of a load port 300.

As FIG. 7A shows, the location of the wafer carrier 100 is defined when a kinematic pin 31 (reference pin) provided on the upper surface of the table 30 fits to a V-groove 15 (V-groove portion) provided on a lower surface of the wafer carrier 100 (not seen in FIG. 4). FIG. 7B is a view showing the alignment by three sets of kinematic pins 31 and V-grooves 15.

Next, the docking of the above-described load port and the wafer carrier will be described below.

Figure 8:
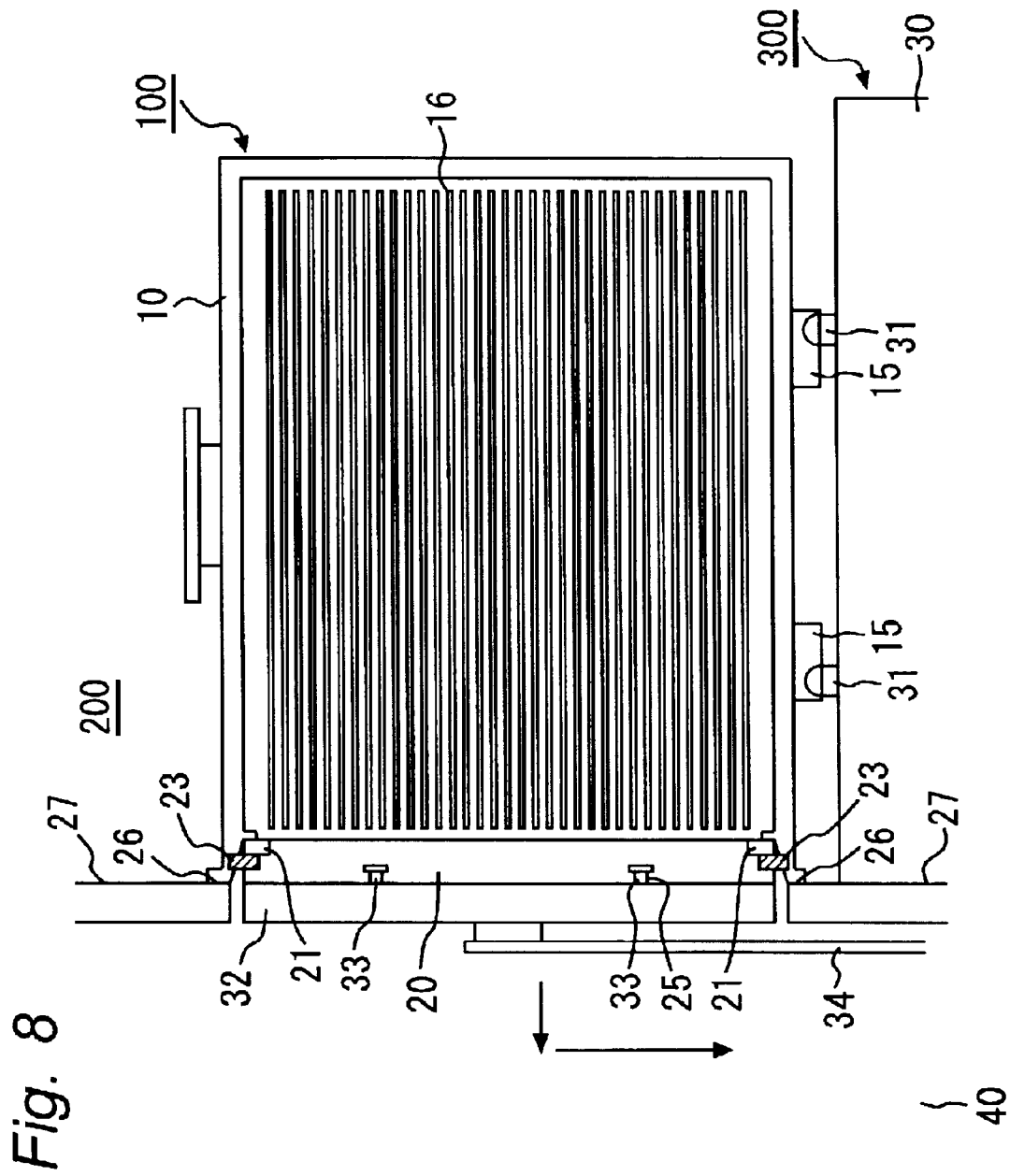
FIG. 8 is a sectional view showing the state where the wafer carrier is allowed to contact the load port of the wafer processing apparatus in First Embodiment.

FIG. 8 is a sectional view showing the state where the wafer carrier 100 is allowed to contact the load port 300 of the wafer processing apparatus 200.

In FIG. 8, reference numeral 100 denotes a wafer carrier, 10 denotes a carrier shell, 20 denotes a carrier door, 24 denotes a latchkey hole, 23 denotes an engaging piece of the door-clamping mechanism, 15 denotes V-grooves, and 16 denotes wafers. Reference numeral 26 denotes a wafer-sealing surface.

Reference numeral 200 denotes a wafer processing apparatus having a load port 300, 30 denotes a table, 31 denotes a kinematic pin formed on the table 30, 32 denotes a load port door (constituting a part of the FIMS surface of the load port 300), 33 denotes latchkeys, and 34 denotes a mechanism for opening and closing a load port door. Reference numeral 40 denotes a mini-environment of the wafer processing apparatus 200, and 27 denotes a wall surface (FIMS sealing surface) of the wafer processing apparatus 200.

Kinematic pins (reference pin) 31 are provided on the upper surface of the table 30 of the load port 300, and V-grooves (V-groove portion) 15 are provided on the bottom (lower surface) of the carrier shell 10. The kinematic pins 31 are fitted to the V-grooves 15 to align the wafer carrier 100.

Latchkeys 33 are provided on the surface of the load port door 32, and inserted into latchkey holes 25 (refer to FIG. 9) for opening and closing the carrier door 20. Thereafter, the carrier door 20 inserted the latchkey 33 thereinto opens and closes the carrier door 20.

The load port door 32 is driven by the mechanism 34 for opening and closing a load port door in the state where the wall surface 27 of the wafer processing apparatus 200 contacts the wafer carrier sealing surface 26. The load port door 32 catches the carrier door 20, and the carrier door 20 opens and closes together with the movement of the load port door 32.

According to First Embodiment, as described above, the atmosphere inside the wafer carrier 100 is purged through the open face 101 of the wafer carrier 100 in the state where the carrier door 20 is open. Therefore, since the gas inside the wafer carrier 100 flows well, the atmosphere inside the wafer carrier 100 can be replaced efficiently in a short time.

By making the space to be purged a small space defined by the EFEM door 43 or the like, the consumption of the environmental gas (inert gas or dry air) can be reduced, and the time for replacing the atmosphere can be shortened.

Although First Embodiment is described by using an example of using an OHT 51 as an automatic conveying means, the present invention is not limited thereto, but an AGV (automated guided vehicle) or a RGV (rail guided vehicle) may be used, and manual conveyors, such as a PGV (person guided vehicle) may also be used.

The above-described small space defined by the upper wall surface 45, the EFEM door 43, and the lower wall surface 46 may be a completely sealed space. When the wafer carrier 100 is formed by the material resistant to vacuum, the atmosphere can be replaced accurately by supplying an inert gas or a dry air after evacuating the small space.

This invention, when practiced illustratively in the manner described above, provides the following major effects:

According to the present invention, there are provided a load port, a wafer processing apparatus, and a method of replacing atmosphere that can replace the atmosphere inside a wafer carrier efficiently in a short time.

Further, the present invention is not limited to these embodiments, but variations and modifications may be made without departing from the scope of the present invention.

The entire disclosure of Japanese Patent Application No. 2001-233959 filed on Aug. 1, 2001 containing specification, claims, drawings and summary are incorporated herein by reference in its entirety.

What is claimed is:

1. A load port for placing a wafer carrier thereon, comprising:
   a first door for opening and closing a carrier door constituting a face of said wafer carrier; and
   an atmosphere replacing mechanism for purging atmosphere inside said wafer carrier through an open face of said wafer carrier in the state where said carrier door is open,
   wherein said atmosphere replacing mechanism comprises:
   a second door for defining a predetermined space adjacent to said open face from a space in which a laminar flow is performed;
   an exhaust opening for discharging gas from said predetermined space; and
   a gas supply port for supplying an inert gas or a dry air into said predetermined space,
   wherein said atmosphere replacing mechanism further comprises an upper wall for defining said predetermined space with said second door, said upper wall interfering the laminar flow in the vicinity of said open face, and
   said gas supply port is attached to an under surface of said upper wall.

2. A wafer processing apparatus having a load port for placing a wafer carrier thereon, comprising:
   a first door for opening and closing a carrier door constituting a face of said wafer carrier;
   an atmosphere replacing mechanism for purging the atmosphere inside said wafer carrier through an open face of said wafer carrier in the state where said carrier door is open; and
   a space for transferring wafers adjacent to said load port,
   wherein said atmosphere replacing mechanism comprises:
   a second door for partitioning said space for transferring wafers into a predetermined space adjacent to said open face; wherein a laminar flow is performed in a said space for transferring wafers;
   an exhaust opening for discharging gas from said predetermined space; and
   a gas supply port for supplying an inert gas or a dry air into said predetermined space,
   wherein said atmosphere replacing mechanism comprises an upper wall for partitioning said space for transferring wafers into a predetermined space with said second door said upper wall interfering the laminar flow in the vicinity of said open face, and
   said gas supply port is attached to an under surface of said upper wall.

* * * * *